(12) United States Patent
McHugh et al.

(10) Patent No.: US 6,648,664 B1
(45) Date of Patent: Nov. 18, 2003

(54) FOLDABLE RETENTION DEVICE FOR PRESSING A HEAT SINK TO AN ELECTRONIC PACKAGE MOUNTED ON A SOCKET CONNECTOR

(75) Inventors: Robert G. McHugh, Golden, CO (US); Hao-Yun Ma, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/218,888

(22) Filed: Aug. 13, 2002

(51) Int. Cl.⁷ ............................................... H01R 13/62
(52) U.S. Cl. ...................... 439/331; 361/704; 361/709
(58) Field of Search ................................. 439/331, 342, 439/368, 330, 68, 487, 485; 361/697, 704, 707, 710, 719, 720, 709; 257/718, 719, 726, 727; 248/505, 510

(56) References Cited

U.S. PATENT DOCUMENTS

| | | | | |
|---|---|---|---|---|
| 4,378,139 A | * | 3/1983 | Griffin et al. | ................ 439/331 |
| 4,381,131 A | * | 4/1983 | Demnianiuk | ................ 439/368 |
| 6,570,763 B1 | * | 5/2003 | McHugh et al. | ............ 361/704 |

* cited by examiner

Primary Examiner—Lynn Feild
Assistant Examiner—Son V. Nguyen
(74) Attorney, Agent, or Firm—Wei Te Chung

(57) ABSTRACT

A retention device (6) for securely retaining a heat sink module (5) and a package (4) upon a socket (3) includes a main frame (60), a spring clip (63) and an actuating lever (64). The main frame is mounted on a printed circuit board (2) surrounding the socket and package. The spring clip is pivotably assembled to the main frame, and includes a receiving arm (631) at a front end thereof. The actuating lever is assembled to the main frame and rotated to press against the receiving arm and securely retaining the heat sink module and package upon the socket.

2 Claims, 4 Drawing Sheets

FOLDABLE RETENTION DEVICE FOR PRESSING A HEAT SINK TO AN ELECTRONIC PACKAGE MOUNTED ON A SOCKET CONNECTOR

CROSS-REFERENCE TO RELATED APPLICATIONS

This patent application is a application with regard to applications with an unknown serial number, entitled "FOLDABLE RETENTION DEVICE FOR LAND GRID ARRAY CONNECTOR ASSEMBLY", filed on Aug. 14, 2002, invented by the same inventor of this patent application; Ser. No. 10/027,706, entitled "LAND GRID ARRAY CONNECTOR ASSEMBLY", filed on Dec. 19, 2001, invented by Hao-Yun Ma; and Ser. No. 09/835,932, entitled "HEAT SINK ASSEMBLY RETAINER DEVICE", filed on Apr. 10, 2001, invented by Atsushi Yoneyama et al.; all assigned to the same assignee as this patent application.

BACKGROUND OF THE INVENTION

1. Field of the Invention

The present invention relates to a land grid array (LGA) connector assembly, and particularly to an LGA connector assembly with a foldable retention device for retaining a heat sink upon an LGA package mounted on an LGA connector.

2. Description of Related Art

IC packages having leads arranged in a land grid array (LGA) are well known as LGA packages. Connectors for removably mounting LGA packages on printed circuit boards (PCBs) are known as LGA sockets which are introduced in the internet website address: http://www.kns.com/prodserv/test-division/products/sockets/BGA-LGA. asp. An LGA socket as described in U.S. Pat. Nos. 5,282,111, 5,485,351 and 5,702,256, comprises a substantially flat insulative housing defining an array of passageways with electrical contacts received therein corresponding with the array of leads of a mating LGA package. Each contact has a pair of free ends oppositely projecting beyond external surfaces of the socket housing for respectively engaging with corresponding contact pads respectively on a bottom surface of the LGA package and on a top surface of the PCB. To dissipate the heat generated by an IC chip incorporated in the LGA package, a heat sink is commonly applied.

Different devices are disclosed by the prior art for clamping the LGA package, the LGA socket and the PCB together, thereby establishing an electrical connection between the contacts of the LGA socket and corresponding contact pads of the LGA package and the PCB. U.S. Pat. No. 4,906,194 discloses an LGA package assembly consisting of an upper support clip, an LGA package, an LGA socket, a PCB, an insulator, and a lower support clip. The components of the LGA package assembly are fastened to each other by a plurality of threaded screw members sequentially extending through bores defined in each component. Therefore, an assembling of the LGA package assembly is laborious and tedious. U.S. Pat. No. 5,847,928 discloses another LGA package assembly consisting of a heat sink, an LGA package, an LGA socket and a PCB. The components are fastened together by a clip disposed on a bottom side of the PCB which has two upwardly extending arms inserted in aligned apertures of the PCB and the heat sink. One problem with this design is that the retention force of the clip for fastening the components of the assembly together is not sufficient enough to prevent physical separation therebetween when the assembly is subject to external shock and vibration. Such a physical separation may result in broken circuits between the LGA package and the PCB, thereby adversely affecting the operation of the LGA package assembly.

Hence, an improved retention device for an LGA connector assembly is required to overcome the disadvantages of the conventional retention device.

SUMMARY OF THE INVENTION

Accordingly, an object of the present invention is to provide a retention device which is foldable to have a lower profile for lowering the shipment cost.

A further object of the present invention is to provide a retention device which can securely fasten an LGA socket, an LGA package, a heat sink module and a printed circuit board together.

Still an object of the present invention is to provide a retention device which can be easily operated to press in sequence a heat sink module, an LGA package and an LGA socket to a printed circuit board.

In order to achieve the objects set forth, a retention device of the present invention comprises a main frame, a spring clip, a pair of front pivots, a pair of rear pivots and an actuating lever. The front and rear pivots are pivotably assembled to the main frame. The spring clip is pivotably attached to the rear pivots, and comprises a downward extending pressing portion for pressing against a heat sink module and a receiving arm extending forwardly from a front end of the pressing portion. The actuating lever is pivotably attached to the front pivots and rotated to lock the receiving arm of the spring clip. Therefore, the spring clip may exert a downward force upon the heat sink module toward an LGA package and securely retain the heat sink module and the LGA package upon an LGA socket which is in turn pressed to a printed circuit board. While the heat sink module and LGA package are not accommodated in a chamber of the main frame, the actuating lever and the spring clip can be removed from the front and rear pivots, whereby the front and rear pivots are rotated/folded to a horizontal position to reduce the profile of the retention device.

Other objects, advantages and novel features of the invention will become more apparent from the following detailed description when taken in conjunction with the accompanying drawings.

DETAILED DESCRIPTION OF THE INVENTION

Figure 1:
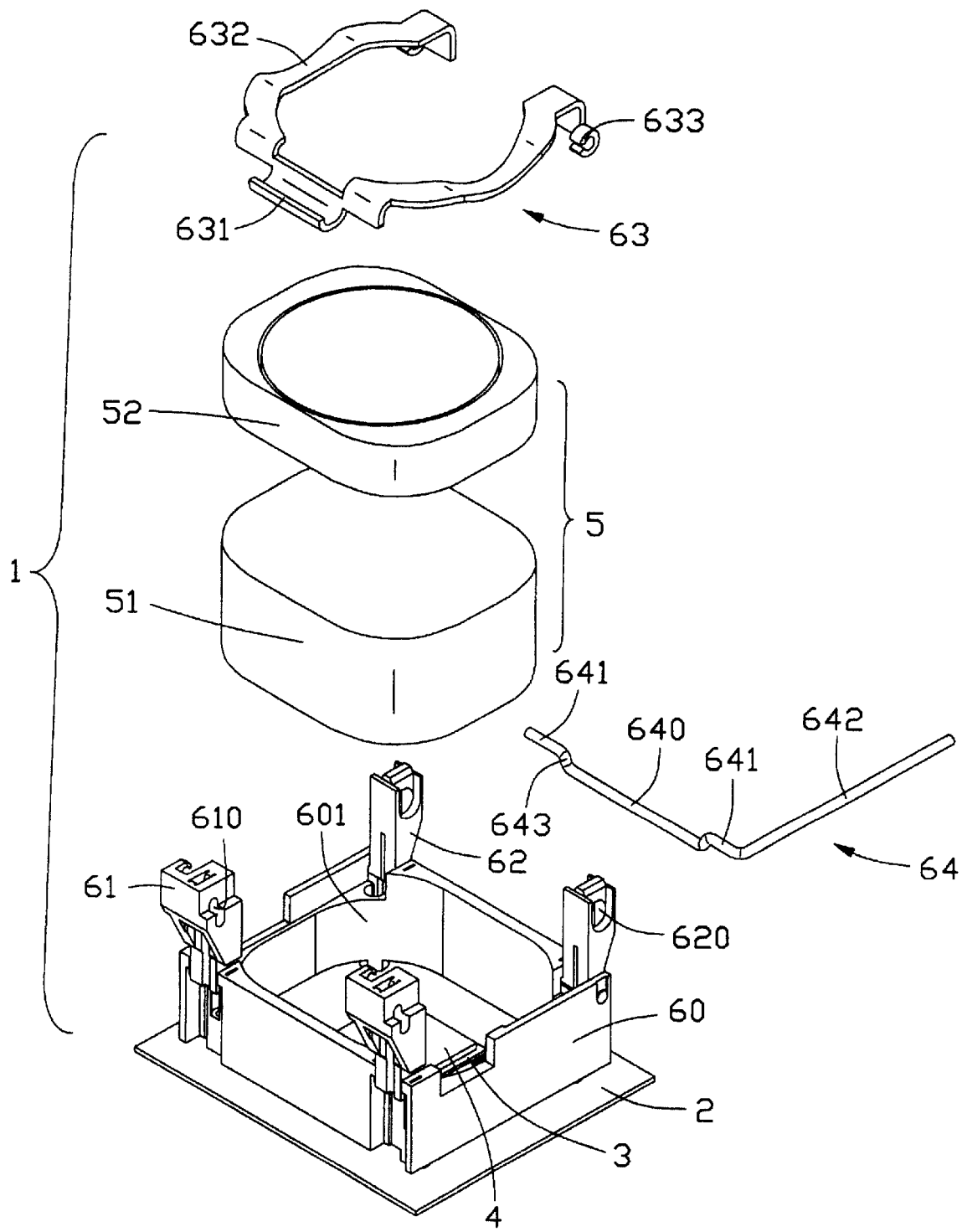
FIG. 1 is an exploded, perspective view a retention device for an LGA connector assembly in accordance with the present invention.

Reference will now be made to the drawing figures to describe the present invention in detail.

Referring to FIG. 1, an LGA connector assembly 1 in accordance with the present invention comprises a PCB 2, an LGA socket 3 mountable on the PCB 2, an LGA package 4 attached to the LGA socket 3, a heat sink module 5 disposed upon the LGA package 4 for dissipating heat generated by the LGA package 4, and a retention device 6 mounted onto the PCB 2 for retaining the heat sink module 5 upon the LGA package 4. The heat sink module 5 includes a heat sink 51 and an electrical fan 52.

The retention device 6 comprises a rectangular main frame 60, a pair of front pivots 61, a pair of rear pivots 62, a spring clip 63 and an actuating lever 64. The main frame 60 defines a chamber 601 for accommodating the LGA socket 3, the LGA package 4 and the heat sink module 5 therein. The main frame 60 further forms four board locks 63 (FIG. 4, only one shown) extending downwardly respectively from four corners of a bottom face of the main frame 60. The board locks 63 are used for securely fixing the main frame 60 to the PCB 2. The front pivots and rear pivots 61, 62 are pivotably assembled to the main frame 60. Each of the front pivots 61 defines a front receiving hole 610 at a top end thereof. Similarly, each of the rear pivots 62 defines a rear receiving hole 620 at a top end thereof. The spring clip 63 comprises a pair of opposite downward extending pressing portions 632, a pair of opposite locating pivots 633 extending outwardly respectively from rear ends of the pressing portions 632 and a bowed receiving arm 631 at a front end thereof.

The actuating lever 64 comprises a driving arm 640, a pair of connecting arms 643 bent in a same direction from lateral ends of the driving arm 640, a pair of locating arms 641 each extending outwardly from an end of a corresponding connecting arm 643 and a handle 642 extending from an end of one of the locating arms 641.

Figure 2:
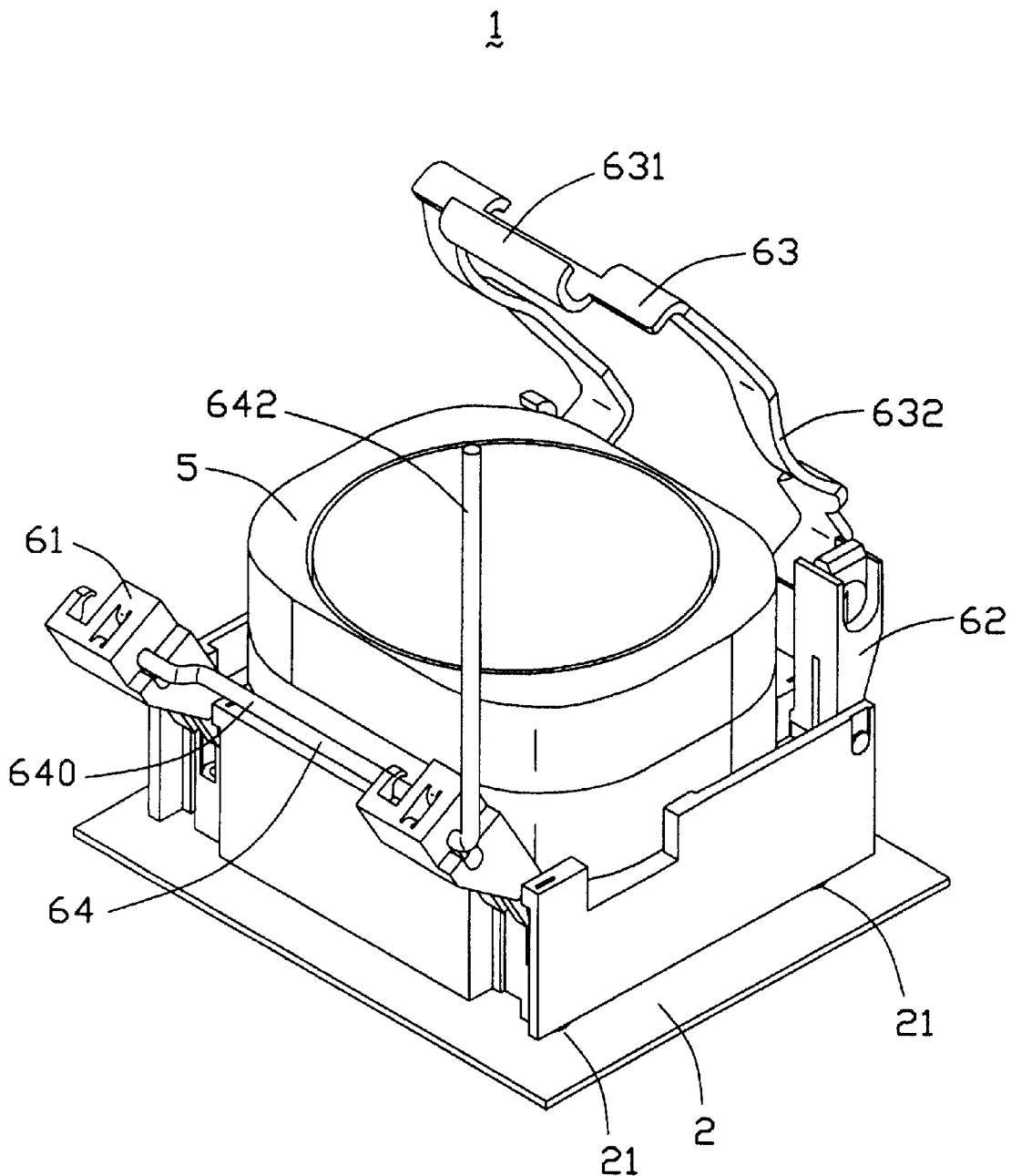
FIG. 2 is an assembled, perspective view of the LGA connector assembly of FIG. 1, wherein a spring clip is unlocked.
Figure 3:
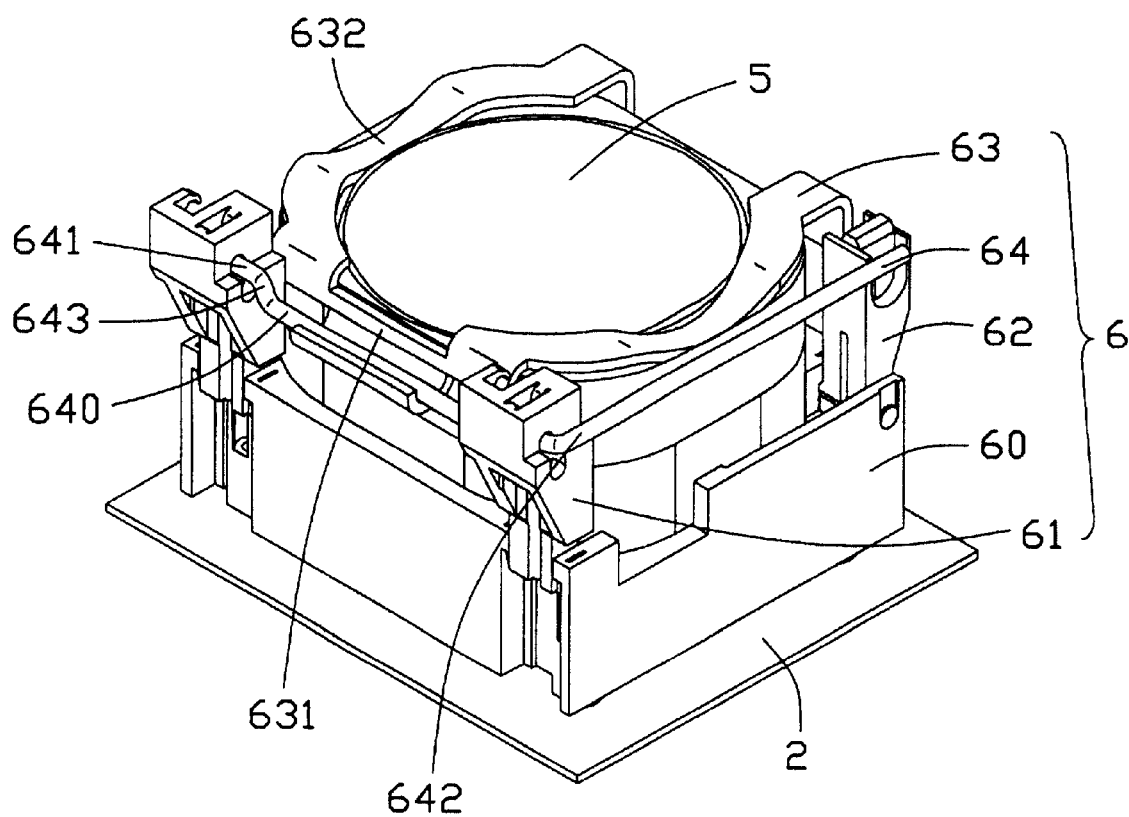
FIG. 3 is a view similar to FIG. 2, wherein the spring clip is locked.

Referring to FIGS. 2–3, in assembly of the retention device 6, the actuating lever 64 is assembled to the front pivots 61 with the locating arms 641 being received in the front receiving holes 610 of the front pivots 61 and the driving arm 640 being located between the front pivots 61. The spring clip 63 is assembled to the rear pivots 62 with the locating pivots 633 being received in the rear receiving holes 620. Then, the front and rear pivots 61, 62 are pivotably assembled to the main frame 60. Successively, the LGA socket 3 is put on the PCB 2 and the main frame 60 of the retention device 6 is mounted upon the PCB 2 with the LGA socket 3 being accommodated in the chamber 601. The board locks 63 are forced into holes 21 of the PCB 2 to have an interferential engagement with the PCB 2 thereby securing the main frame 60 together with the front, rear pivots 61, 62 and the spring clip 63 and actuating lever 64 to the PCB 2. Bottom ends of contacts (not shown) of the LGA socket 3 contact with conductive pads (not shown) on the PCB 2. The LGA package 4 is placed upon the LGA socket 3 with conductive pads of the LGA package 4 electrically connecting with top ends of the contacts of the LGA socket 3. Then, the heat sink module 5 is placed upon the LGA package 4, with the heat sink 51 on the LGA package 4 and the electrical fan 52 on the heat sink 51.

In assembly, the spring clip 63 is pivotably moved to a horizontal position and upon the heat sink module 5 with the rear pivots 64 being pivotably rotated to a vertical position. The front pivots 61 are rotated to a vertical position and the actuating lever 64 is rotated with the driving arm 640 moving from an upper position to a lower position. Therefore, the driving arm 640 locks into the bowed receiving arm 631 and exerts a depressing force thereto whereby the pressing portions 632 of the spring arm 63 press downwardly against the heat sink module 5. Thus, the LGA socket 3, the LGA package 4 and the heat sink module 5 are securely retained to the PCB 2 by the retention device 6.

Figure 4:
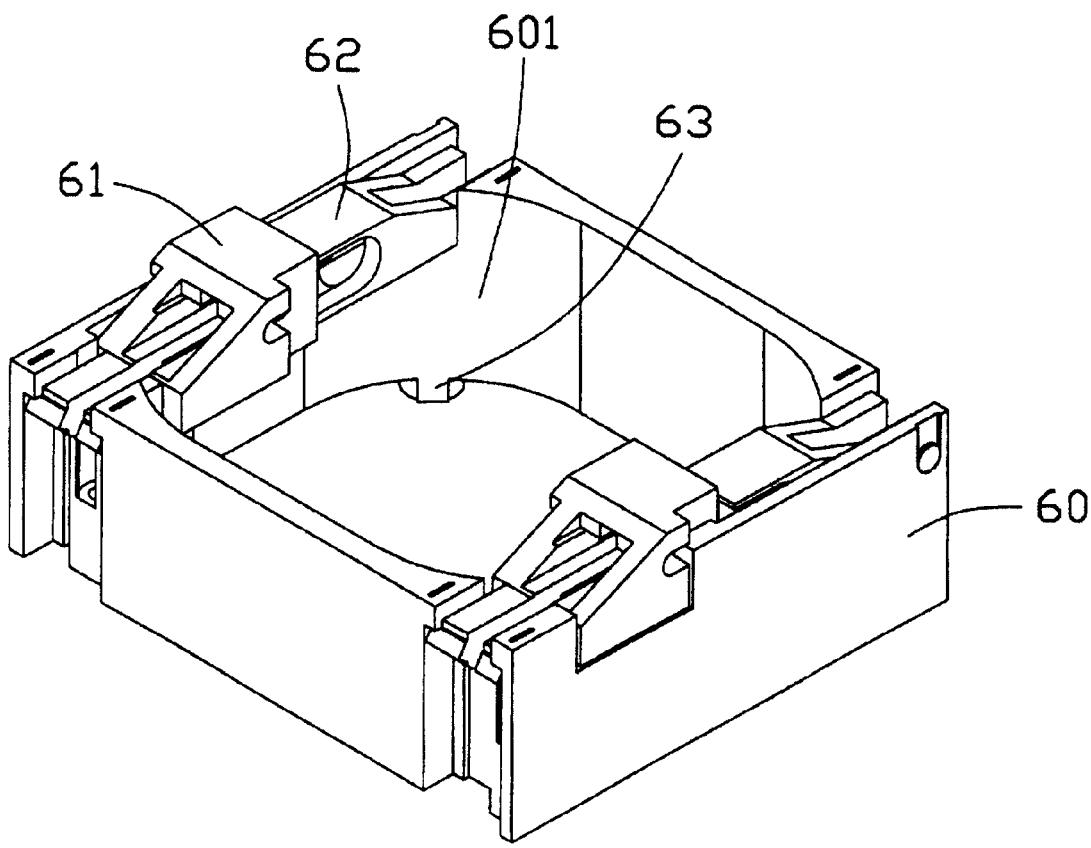
FIG. 4 is a perspective view of the retention device in a folded position.

Referring to FIG. 4, while the LGA package 4 and the heat sink module 5 are removed from the LGA socket 3, the retention device 6 may be folded to reduce occupied space. The actuating lever 64 and the spring clip 63 are respectively removed from the front and rear pivots 61, 62. The front and rear pivots 61, 62 are rotated/folded inwardly to a horizontal position within the main frame 60. At this state, the retention device 6 has a lower profile than that when the front and rear pivots 61, 62 are unfolded. So, the folded retention device 6 occupies a limited space which is helpful to reduce the shipment and inventory cost.

In addition, the front and rear pivots are assembled to the main frame and each has an extendable length. While the heat sink module is not accommodated in the chamber, the front and rear pivots are drawn back to a short length to reduce the profile of the retention device. However, while the heat sink module is accommodated in the chamber, the front and rear pivots are drawn out in order that the spring clip may be locked by the actuating lever and the heat sink module is securely retained in the chamber. Understandably, in this embodiment, the moveable clip/actuating lever mounting device, i.e., the pivots 61, 62, rotatable relative to the main frame for reducing the height/profile during shipping/delivery. Anyhow, other variable ways such as linear extendable/retractable movement, translation, swinging, combination of sliding and rotation, etc., may be applied to the mounting device design of the invention for achieving the same purpose.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A retention device for securely retaining a heat sink module and a package upon a socket, comprising:

a main frame defining a chamber adapted for accommodating the heat sink, the socket and the package therein;

a front pivot pivotably assembled to a front end of the main frame;

a rear pivot pivotably assembled to a rear end of the main frame;

a spring clip being pivotably attached to the rear pivot and comprising a downward extending pressing portion for pressing against the heat sink module and a receiving arm extending forwardly from a front end of the pressing portion; and an actuating lever being pivotably attached to the front pivot and being rotatable to lock the receiving arm, whereby the spring clip can exert a force upon the beat sink module toward the package, wherein when the heat sink module is not accommodated in the chamber, the front and rear pivots are foldable to a horizontal position to reduce a profile of the retention device; wherein the rear pivot defines a rear receiving hole and the spring clip further comprises a locating pivot pivotably received in the rear receiving hole; wherein the front pivot defines a front receiving hole for retaining the actuating lever therein; wherein the actuating lever comprises a driving arm for pressing against the receiving arm, a connecting arm bent from an end of the driving arm a locating arm extending outwardly from the connecting arm and a handle extending perpendicularly from the locating arm; wherein the front pivot defines a front receiving hole for receiving the locating arm of the actuating lever.

2. An electrical connector assembly comprising:

a printed circuit board (PCB);

a socket located on the PCB;

an IC package attached upon the socket and electrically connecting the PCB via the socket;

a heat sink module attached upon the IC package for dissipating heat generated by the IC package; and a retention device mounted upon the PCB, comprising:
- a main frame defining a chamber to accommodate the socket, the IC package and the heat sink module therein;
- front and rear pivots pivotably attaching to the main frame;
- a spring clip being pivotably assembled to the rear pivot and rotatable to retaining the heat sink module and the package upon the socket; and
- an actuating lever being pivotably assembled to the front pivot and rotatable to lock the spring clip; wherein the front and rear pivots are foldable to a horizontal position to reduce a profile of the retention device when the heat sink module is not accommodated in the chamber; wherein the actuating lever comprises a driving arm for pressing against the spring clip, a connecting arm extending perpendicularly from the driving arm, a locating arm extending outwardly from the connecting arm, and a handle extending perpendicularly from locating arm; wherein the front pivot defines a front receiving hole for receiving the locating arm of the actuating lever; wherein the spring clip comprises a locating pivot at a rear end thereof and the rear pivot defines a rear receiving hole for receiving the locating pivot.

* * * * *